US008547518B2

(12) United States Patent
Ono

(10) Patent No.: US 8,547,518 B2
(45) Date of Patent: Oct. 1, 2013

(54) STAGE BASE, STAGE APPARATUS, EXPOSURE APPARATUS, AND DEVICE MANUFACTURING METHOD

(75) Inventor: Kazuyuki Ono, Shiga (JP)

(73) Assignee: Canon Kabushiki Kaisha, Tokyo (JP)

( * ) Notice: Subject to any disclaimer, the term of this patent is extended or adjusted under 35 U.S.C. 154(b) by 695 days.

(21) Appl. No.: 11/538,985

(22) Filed: Oct. 5, 2006

(65) Prior Publication Data

US 2007/0081142 A1 Apr. 12, 2007

Related U.S. Application Data

(62) Division of application No. 10/943,010, filed on Sep. 17, 2004, now Pat. No. 7,139,065.

(30) Foreign Application Priority Data

Sep. 26, 2003 (JP) ................ 2003-335643

(51) Int. Cl.
*G03B 27/52* (2006.01)
*G03B 27/58* (2006.01)
*G03B 27/62* (2006.01)
*G03B 27/42* (2006.01)
*G03B 27/60* (2006.01)

(52) U.S. Cl.
USPC .......... 355/30; 355/53; 355/72; 355/73; 355/75; 355/76

(58) Field of Classification Search
USPC ........... 355/30, 53, 72–76; 165/206; 310/10, 310/12, 12.22, 12.23, 12.29, 16; 250/492.1, 250/492.2, 492.22, 428, 429, 453.11; 318/135, 318/650; 700/19, 121; 510/247
See application file for complete search history.

(56) References Cited

U.S. PATENT DOCUMENTS

| 5,040,431 A | 8/1991 | Sakino et al. .............. 74/479 |
| 5,134,436 A * | 7/1992 | Fujioka ....................... 355/30 |
| 5,440,397 A | 8/1995 | Ono et al. .................. 356/401 |

(Continued)

FOREIGN PATENT DOCUMENTS

| JP | 2000-175434 | 6/2000 |
| JP | 3145355 | 1/2001 |
| JP | 2001-290543 | 10/2001 |
| JP | 2003-224961 | 8/2003 |

OTHER PUBLICATIONS

Japanese Office Action dated Jun. 16, 2008, issued in corresponding Japanese patent application No. 2003-335643, with an English translation.

(Continued)

*Primary Examiner* — Toan Ton
*Assistant Examiner* — Christina Riddle
(74) *Attorney, Agent, or Firm* — Fitzpatrick, Cella, Harper & Scinto

(57) ABSTRACT

A stage base includes a plate which supports a stage. The plate has a first structure and a second structure, and the first and second structures are coupled. The stage base further includes a component which is arranged on the plate and has a cooling unit, a coolant channel arranged to extend through the plate into the component, and a seal member arranged between the first structure and the second structure so as to surround the coolant channel, an interior and an exterior of the seal member being fastened with a fastener.

13 Claims, 11 Drawing Sheets

(56) References Cited

U.S. PATENT DOCUMENTS

| | | | |
|---|---|---|---|
| 5,487,822 A * | 1/1996 | Demaray et al. | 204/298.09 |
| 5,523,843 A | 6/1996 | Yamane et al. | 356/363 |
| 5,531,583 A * | 7/1996 | Berns et al. | 425/193 |
| 5,783,877 A * | 7/1998 | Chitayat | 310/12.33 |
| 5,998,889 A * | 12/1999 | Novak | 310/12.29 |
| 6,084,319 A * | 7/2000 | Kamata et al. | 310/12 |
| 6,134,981 A * | 10/2000 | Novak et al. | 74/490.09 |
| 6,555,936 B1 * | 4/2003 | Tanaka et al. | 310/12 |
| 6,590,355 B1 * | 7/2003 | Kikuchi et al. | 310/12.06 |
| 6,657,204 B2 * | 12/2003 | Buis et al. | 250/398 |
| 6,677,167 B2 | 1/2004 | Kanno et al. | 438/14 |
| 6,762,516 B2 * | 7/2004 | Maruyama | 310/12.04 |
| 6,810,298 B2 | 10/2004 | Emoto | 700/121 |
| 6,864,602 B2 * | 3/2005 | Korenaga | 310/12.24 |
| 6,866,094 B2 | 3/2005 | Cousineau et al. | 165/278 |
| 7,139,065 B2 * | 11/2006 | Ono | 355/72 |
| 7,282,821 B2 | 10/2007 | Kubo et al. | 310/12 |
| 2001/0055102 A1 * | 12/2001 | Emoto | 355/53 |
| 2002/0113498 A1 * | 8/2002 | Emoto | 310/12 |
| 2003/0058426 A1 | 3/2003 | Watson et al. | 355/73 |
| 2003/0136923 A1 * | 7/2003 | Watson | 250/492.3 |
| 2003/0141769 A1 * | 7/2003 | Kubo | 310/12 |
| 2003/0155818 A1 * | 8/2003 | Koyanagawa et al. | 310/12 |
| 2004/0126907 A1 * | 7/2004 | Korenaga | 438/10 |
| 2004/0130688 A1 | 7/2004 | Emoto | 355/30 |
| 2004/0145713 A1 | 7/2004 | Ono | 355/53 |
| 2005/0012404 A1 * | 1/2005 | Onishi | 310/12 |
| 2005/0057102 A1 * | 3/2005 | Totsu et al. | 310/12 |
| 2005/0057738 A1 * | 3/2005 | Tsuji | 355/67 |

OTHER PUBLICATIONS

Patent Abstracts of Japan for Publication No. 11-023752, Jan. 29, 1999.

* cited by examiner ns and X stage 51 constitute an X-Y
STAGE BASE, STAGE APPARATUS, EXPOSURE APPARATUS, AND DEVICE MANUFACTURING METHOD This application is a divisional application of copending U.S. patent application Ser. No. 10/943,010, filed Sep. 17, 2004.

FIELD OF THE INVENTION

The present invention relates to a stage base applied to a stage apparatus and, more specifically, to a stage apparatus having a cooling mechanism, which is coupled to a fine adjustment stage and can perform cooling by the circulation of a cooling medium. The present invention also relates to an exposure apparatus and a device manufacturing method which use the stage apparatus.

BACKGROUND OF THE INVENTION

There is available an exposure apparatus, such as a stepper, which projects, onto a wafer, a pattern drawn on a mask or a reticle for manufacturing semiconductor devices (see, e.g., Japanese Patent No. 3,145,355). This type of exposure apparatus has a function of aligning a wafer and a reticle before exposure. There are generally two types of alignment methods, a step and repeat type method, and a step and scan type method. The step and repeat type method measures a shift between a master, such as a reticle bearing a pattern for exposure, and an object to be exposed (substrate), such as a wafer, and repeatedly steps the object to be exposed on the basis of the measurement result, thereby performing exposure. The step and scan type method moves the master and the object to be exposed relative to each other, thereby performing exposure. These exposure apparatuses are required in terms of resolution and overlay accuracy to align at extremely high precision a wafer stage, which moves while holding an object to be exposed (e.g., a wafer). In recent years, high-speed alignment has been demanded in order to increase the productivity.

FIG. 7 is a perspective view showing a conventional wafer stage in an exposure apparatus. In FIG. 7, a Y stage 54 serving as a moving mechanism in the Y direction is mounted on a stage surface plate 55. An X stage 51 serving as a moving mechanism in the X direction is mounted on the Y stage 54. In this manner, the Y stage 54 and X stage 51 constitute an X-Y stage 56.

FIG. 8 is a schematic view showing the arrangement of the X-Y stage. The stage surface plate has a reference plane whose upper surface is smooth. The X-Y stage 56 comprises the Y stage 54 (54a, 54b, 54c, and 54d) serving as a moving member and X stage 51 serving as a moving member. A fixed guide 52 is provided in the horizontal direction (Y-axis direction) of the Y stage 54. Porous hydrostatic air bearings are provided in the horizontal direction (X-axis direction) of the X stage 51, the vertical direction (Z-axis direction) of the X stage 51, the horizontal direction (Y-axis direction) of the Y stage 54, and the vertical direction of the Y stage 54, respectively, to guide the stages.

The Y stage 54 levitates from the stage surface plate 55 by supplying air to the hydrostatic air bearings. The Y stage 54 moves by the driving actuators 54c on both sides of the stage surface plate 55 in the Y direction along the fixed guide 52 on one side. The X stage 51 levitates from the stage surface plate 55 by supplying air to the hydrostatic air bearings, similarly to the Y stage 54. The X stage 51 moves by a driving actuator 51c in the X direction using the side surfaces 54b of the Y stage 54 as a horizontal guide. At this time, a plurality of pressure applying magnetic units (not shown) adjust the X stage 51 and Y stage 54 so as to maintain respective constant postures.

FIG. 9 is a schematic view showing the arrangement of a fine adjustment stage 90. The X-Y stage 56 (see FIG. 8) having a reference plane which exerts a thrust or an attraction force on the fine adjustment stage 90 is arranged below the fine adjustment stage 90. The fine adjustment stage 90 is mounted in non-contact with a stage base 50' on the X stage 51. The X-Y stage 56 has linear motors 11, 12 and 13, which finely control the posture of the fine adjustment stage 90 with respect to the reference plane, and cylindrical electromagnet units 21, 22 and 23, which transmit acceleration in the X and Y directions to the fine adjustment stage 90. The fine adjustment stage 90 also comprises a self-weight compensating mechanism 3 for supporting its own weight.

With this arrangement, a thrust can be applied by the linear motors 11, 12, and 13 from the X-Y stage 56 to the fine adjustment stage 90. A large attraction force in the X and Y directions can be applied by the electromagnet units 21, 22, and 23.

When the fine adjustment stage 90 is supported in non-contact with the X-Y stage 56, the linear motors 11, 12, and 13 are required to have the capability to accelerate the fine adjustment stage 90 at a desired acceleration. For this reason, the linear motors 11, 12, and 13 are predicted to generate heat in driving the fine adjustment stage 90. To cope with this, the linear motors 11, 12, and 13 have cooling mechanisms. The cooling mechanisms suppress external leakage of heat generated in the linear motors 11, 12, and 13.

FIG. 10 is a schematic view showing a linear motor coil 113, which is arranged on a support surface 100' of the stage base 50' to drive the fine adjustment stage 90, and a component 1, which comprises a cooling mechanism for cooling the linear motor coil 113. The component 1 is generally formed by covering the linear motor coil 113 with a jacket 112 and is arranged to supply a cooling medium into the jacket 112 using a resin tube 111. With this arrangement, the component 1 can cool the linear motor coil 113. As shown in FIG. 10, each of the ends of the resin tube 111 is shown as being truncated, merely for illustrative convenience. The ends, however, are not connected to and do not enter inside the stage base 50'.

As for the electromagnet units 21, 22, and 23 shown in FIG. 9, a large attraction force is applied to the fine adjustment stage 90 when driving the X-Y stage 56 shown in FIGS. 7 and 8. For this reason, the coils of the electromagnet units 21, 22, and 23 are also predicted to generate heat. Providing a cooling mechanism for the coils of the electromagnet units 21, 22, and 23 in the same manner as that for the linear motors 11, 12, and 13 can suppress external leakage of heat generated in the coils. Similar to the linear motors, each of the cooling mechanisms is formed by covering its coil with a jacket and is arranged to supply a cooling medium into the jacket using the resin tube 111.

A conventional stage apparatus which distributes and supplies through resin tubes a cooling medium to components having cooling mechanisms coupled to a fine adjustment stage has the following problems.

(1) If each resin tube is fixed and arranged on a stage base so as to prevent vibration of the resin tube, the size of a mounting portion for mounting the resin tube increases, and the mounting portion may interfere with surrounding components or may increase in mass.

(2) Guiding the resin tubes increases disturbance and interferes with high-precision alignment.

If the stage apparatus is placed in a vacuum chamber and used in a vacuum environment or a reduced-pressure environment, outgassing occurs in a large quantity from the resin tubes. This may cause contamination (adhesion of a contaminant) or may decrease the vacuum degree in the vacuum chamber.

SUMMARY OF THE INVENTION

The present invention has been made in consideration of the above-mentioned problems, and has as its object to minimize the number of resin tubes used to supply a cooling medium to components having cooling units.

According to the present invention, there is provided a stage base comprising a plate which supports a stage, a component which is arranged on a support surface and has a cooling unit, and a coolant channel which is arranged so as to extend through the plate into the component.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

The present invention will be described in detail with reference to the accompanying drawings.

Figure 1:
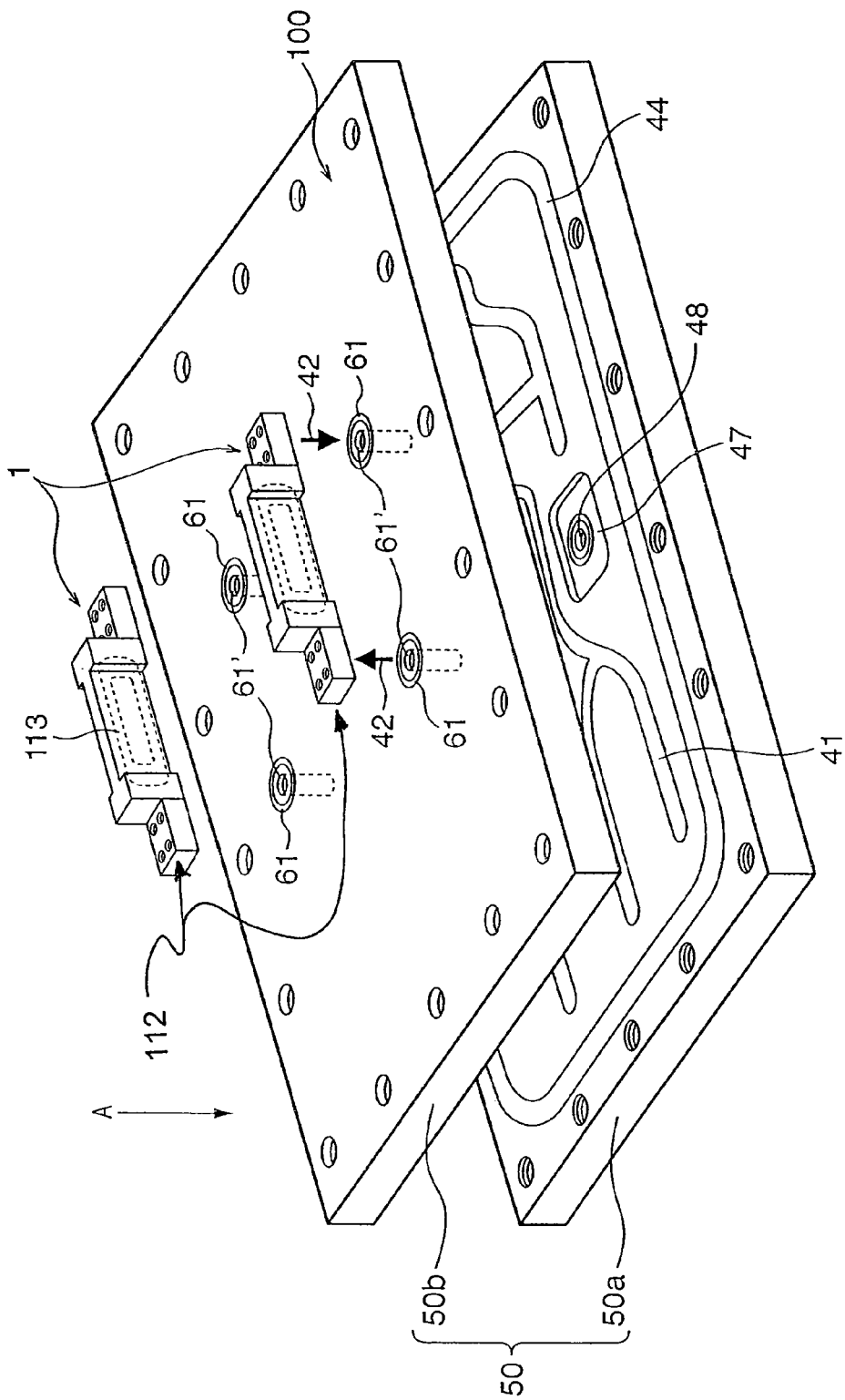
FIG. 1 is a view showing a stage base according to a preferred embodiment of the present invention and a cooling unit applied to a fine adjustment stage.

FIG. 1 is a view showing a stage base 50 according to a preferred embodiment of the present invention, and components 1 each having a cooling unit coupled to the stage base 50. FIG. 1 is an exploded view showing a linear motor stator jacket 112 as an example of the cooling unit.

Figure 7:
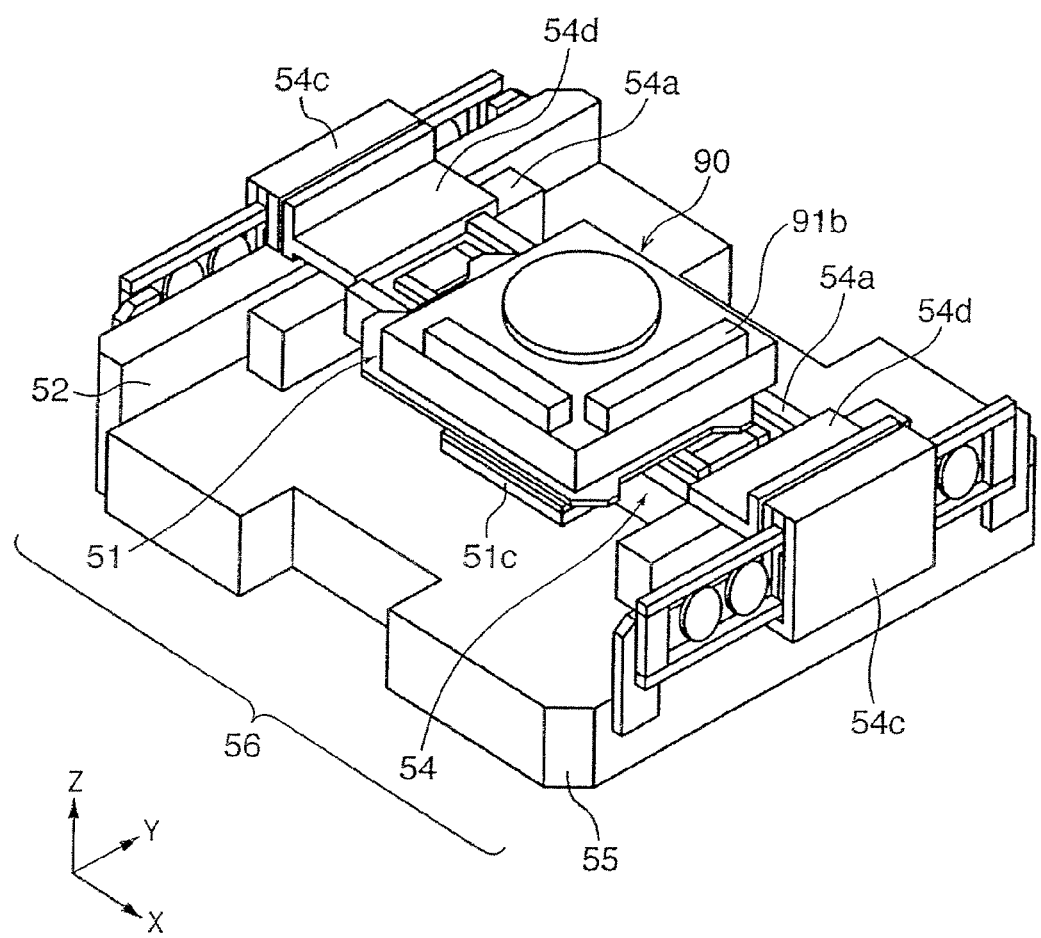
FIG. 7 is a perspective view showing a wafer stage applied to a conventional exposure apparatus.
Figure 8:
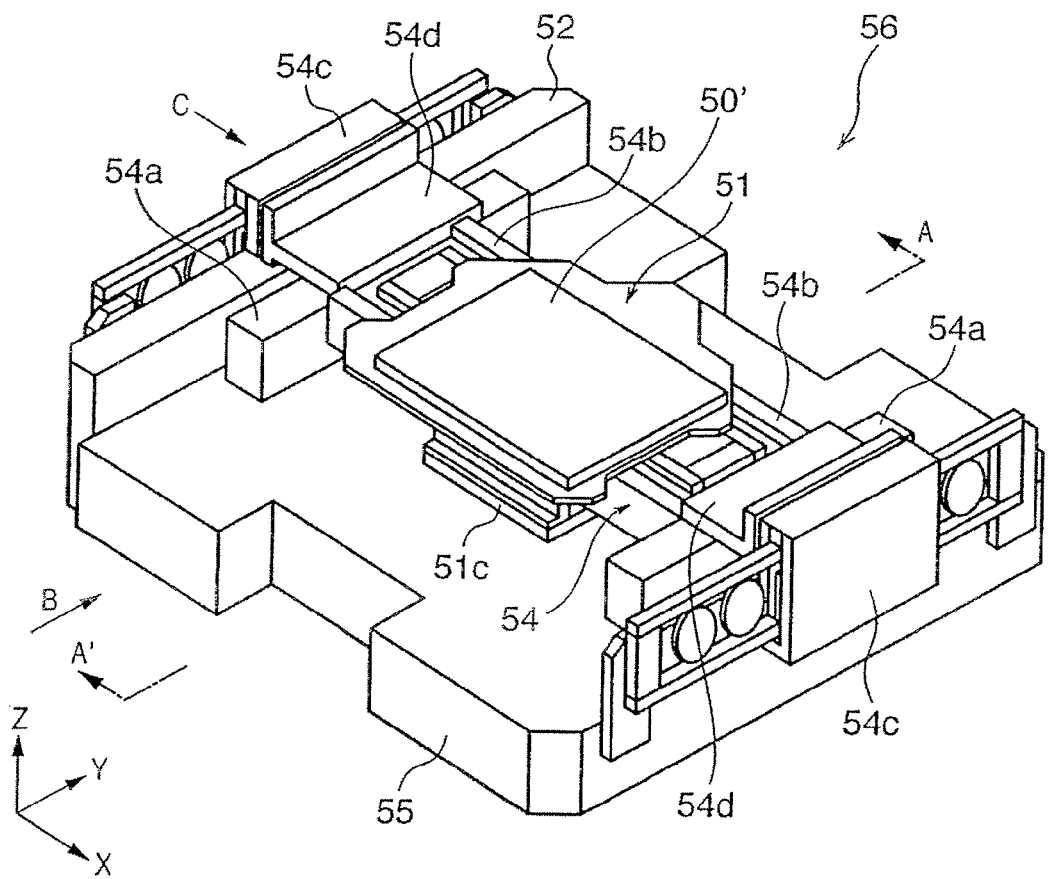
FIG. 8 is a schematic view showing the arrangement of a conventional X-Y stage.

As shown in FIG. 1, the stage base 50 is formed as one structure by fastening two structures, a base plate 50a and base plate 50b, with fasteners, such as bolts. The base plate 50b has a support surface 100, which movably supports a fine adjustment stage 90 (FIG. 9) having a fine stroke. A stage apparatus according to this embodiment is roughly obtained by partially changing the arrangement of the stage apparatus shown in FIG. 7 or 8. More specifically, in the stage apparatus according to this embodiment, the stage base 50 shown in FIG. 1 is provided on the X stage 51 in FIG. 8, instead of the stage base 50'. As the material for the stage base 50, a ceramic material is preferably used for weight reduction and high rigidity. However, the present invention is not limited to this, and another material, such as a metal may be used.

Grooves 41 are formed in the surface of the base plate 50a. Fastening the base plate 50a and base plate 50b forms internal channels for distributing and supplying a cooling medium 42 between the grooves 41 and the base plate 50b. A seal groove 44 is formed in the base plate 50a so as to surround the grooves 41. Fitting an O-ring (not shown) serving as a seal member into the seal groove 44 makes it possible to prevent the cooling medium circulating through the grooves 41, serving as the internal channels, from leaking outside the stage base 50. Note that the seal member is not limited to this O-ring. For example, a gasket or an adhesive may be used instead. The fine adjustment stage 90 is preferably arranged to have three or more degrees of freedom.

Figure 9:
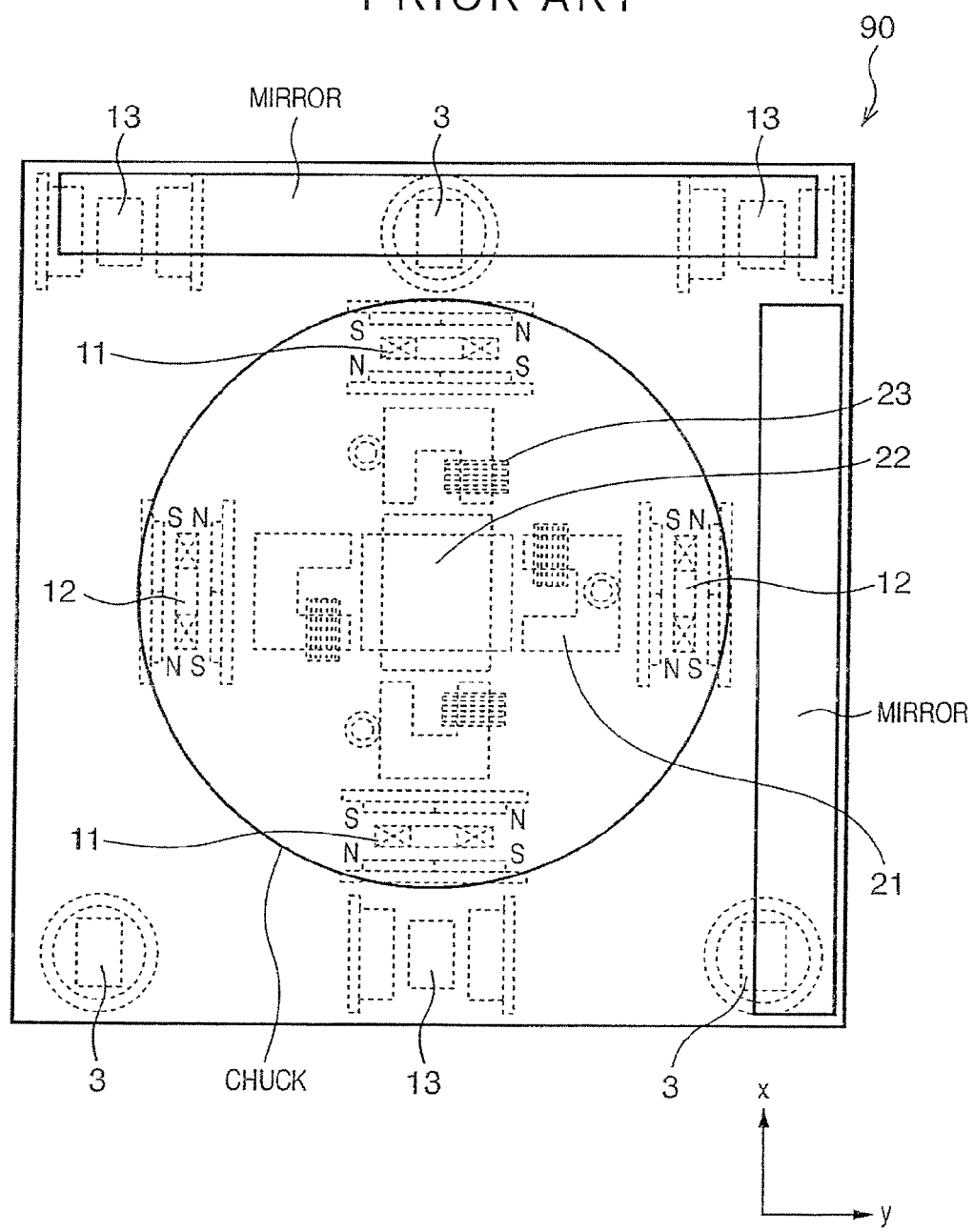
FIG. 9 is a schematic view showing the arrangement of a conventional fine adjustment stage.

Linear motor coils 113 for driving the fine adjustment stage 90 in FIG. 9 and the components 1 having cooling mechanisms for cooling the linear motor coils 113 are arranged on the support surface 100 of the stage base 50. Each component 1 is arranged on the support surface 100 so as to cover the corresponding linear motor coil 113.

Figure 10:
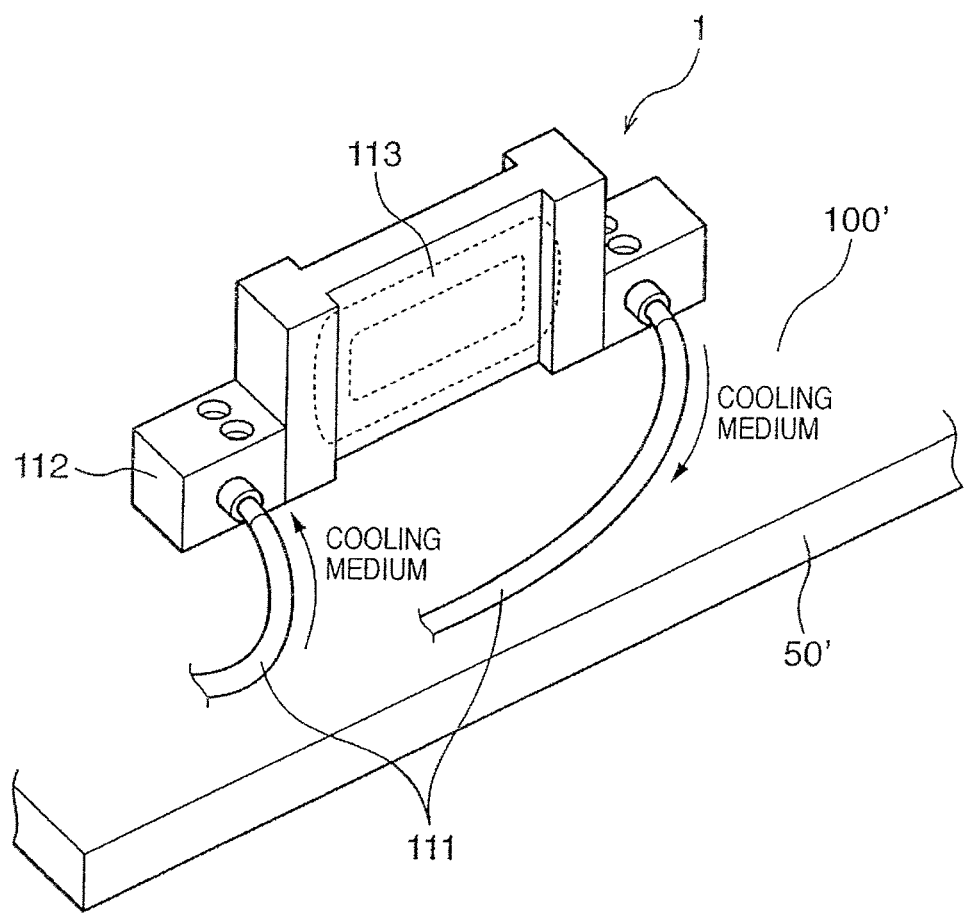
FIG. 10 is a schematic view showing a conventional stage base and a cooling unit applied to a fine adjustment stage.

Seal grooves 61 are formed in the base plate 50b. Providing a seal member, such as an O-ring (not shown), for each seal groove 61 and fastening the components 1 (e.g., linear motor stator jackets) having the cooling units to the stage base 50 makes it possible to prevent the cooling medium from leaking to the outside. A through-hole 61', which communicates with the corresponding groove 41, is formed inside each seal groove 61. Coupling the components 1 on the support surface 100 to the through-holes 61' makes it possible to directly supply the cooling medium to the components 1 through the grooves 41. Thus, the resin tube 111 (FIG. 10) used to couple the stage base 50 and each component 1 becomes unnecessary.

In this embodiment, the seal grooves 61 are formed in the base plate 50b. The present invention, however, is not limited to this, and the seal grooves 61 may be formed in the linear motor stator jackets 1. In this embodiment, the grooves 41 are formed in the base plate 50a. The present invention, however, is not limited to this. The grooves 41 need only be formed in at least one of the base plates 50a and 50b, which constitute the stage base 50. The seal groove 44 is formed in the member having the grooves 41 (in this embodiment, the base plate 50a). The present invention, however, is not limited to this. The seal groove 44 need only be formed in at least one of the base plates 50a and 50b. In this embodiment, the two flat plates are fastened to form the channels inside the stage base 50. The present invention, however, is not limited to this. The grooves 41 may be formed inside one flat plate.

Arrangement examples of stage bases according to the preferred embodiment of the present invention will be described with reference to FIG. 2. The grooves 41 (hatched portions), serving as the internal channels, are formed in the surface of the base plate 50a. Inlets 41a are ports through which the supplied cooling medium flows out. The grooves 41 serving as the internal channels comprise a plurality of lines. The plurality of lines can be arranged to have almost the same line resistance. More specifically, the grooves 41 can be arranged such that the channels have almost the same line resistance when the cooling medium from the inlets 41a passes through the grooves 41 and components 1 to the outlets 41b. The seal groove 44 is formed outside the grooves 41. The seal groove 44 uses the seal member, such as an O-ring, to prevent the cooling medium flowing through the grooves 41 from leaking outside the stage base 50.

Threaded hole portions 45 and 46 are formed to fasten the base plate 50a and the base plate 50b of FIG. 1 with fasteners, such as bolts. To suppress a stress which acts on the ceramic plate 50b when applying a force to the seal member, such as an O-ring, the threaded hole portions 45 and 46 are desirably arranged on both sides of the O-ring.

Figure 3:
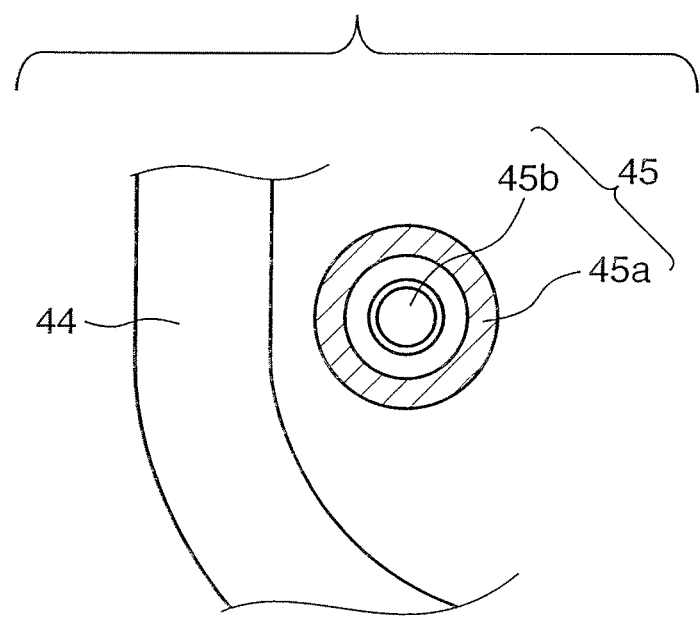
FIG. 3 is an enlarged view of the vicinity of a threaded hole portion formed inside a seal groove.

FIG. 3 is an enlarged view of the vicinity of each threaded hole portion 45 inside the seal groove 44. The threaded hole portion 45 comprises a threaded hole 45b and a groove 45a (hatched portion) for a seal member, such as an O-ring. The cooling medium supplied to the grooves 41 may enter the gap between the base plate 50a and the base plate 50b due to the internal pressure of the cooling medium. For this reason, to prevent the cooling medium from leaking from the threaded hole 45b outside the stage base, it is desirable to form the seal groove 45a around the threaded hole 45b inside the seal groove 44 and to perform sealing with a seal member, such as an O-ring.

The stage base in the first arrangement example has at least the following features.

(1) A cooling medium is directly supplied through the internal channels to the components, each of which is used for, e.g., a linear motor, and has the cooling unit. With this arrangement, interference with surrounding components due to resin tube coupling and disturbance in high-precision alignment can be suppressed.

(2) The grooves are formed such that internal channels have almost the same line resistance when the cooling medium is supplied from each inlet of the stage base to the component having the cooling unit. With this arrangement, these members can uniformly be cooled.

In this arrangement example, the threaded hole portions 45 and 46 for fastening the stage base 50 are formed on the ceramic plate 50a side. The present invention, however, is not limited to this, and the threaded hole portions 45 and 46 may be formed on the ceramic plate 50b side.

Second Arrangement Example

Figure 2:
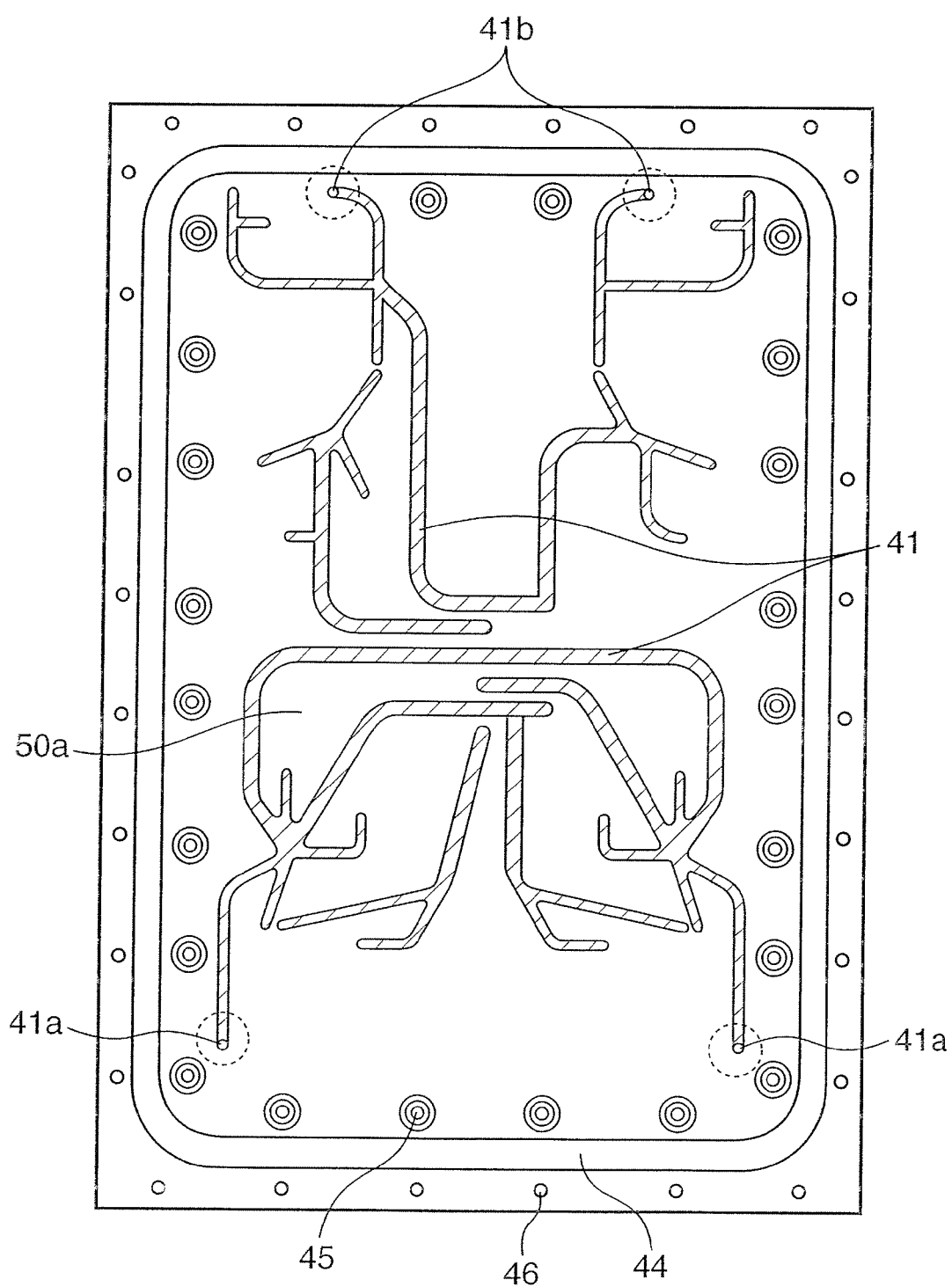
FIG. 2 is a view showing the first arrangement example according to the preferred embodiment of the present invention.
Figure 4:
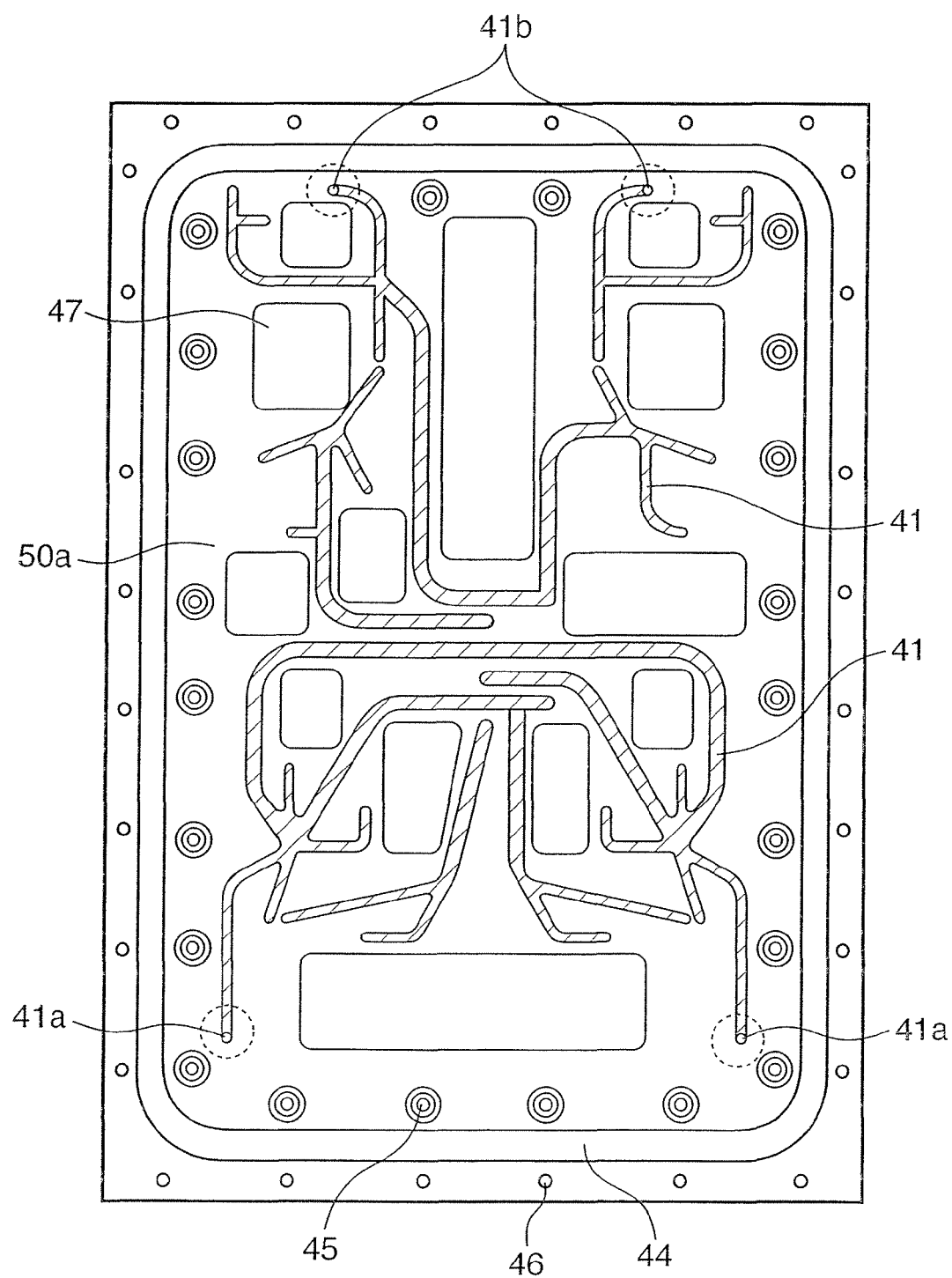
FIG. 4 is a view showing the second arrangement example according to the preferred embodiment of the present invention.

FIG. 4 is a view exemplifying the second arrangement example, which is a modification of the first arrangement example shown in FIG. 2. The same reference numerals as those in this arrangement example denote the same parts as those in the first arrangement example. In the arrangement example of FIG. 2, the base plates 50a and 50b are fastened with fasteners, such as bolts, in the threaded hole portions 45 and 46 on both sides of the seal groove 44. The arrangement example of FIG. 4 considers a case wherein the stage base is used in a vacuum environment or a reduced-pressure environment. The arrangement of FIG. 4 is obtained by adding to the arrangement of FIG. 2 adhesive reservoirs 47 for filling, with an adhesive (not shown), portions within the seal groove 44, except for the grooves 41. With this arrangement, the second arrangement example has the following feature, in addition to the features (1) and (2) described in the first arrangement example.

(3) When a cooling medium supplied to the internal channels enters the gap region between the base plate 50a and the base plate 50b, except for the internal channels, the adhesive reservoirs reduce an area on which a pressure difference between the cooling medium and the outside of the stage base (vacuum or reduced-pressure atmosphere) acts (area in which the cooling medium may flow). This makes it possible to reduce a force by the pressure difference and more securely fix the base plates 50a and 50b. Stress concentration on the threaded hole portions 45, through which the base plates 50a and 50b are fastened, can, therefore, be relaxed.

Third Arrangement Example

Figure 5:
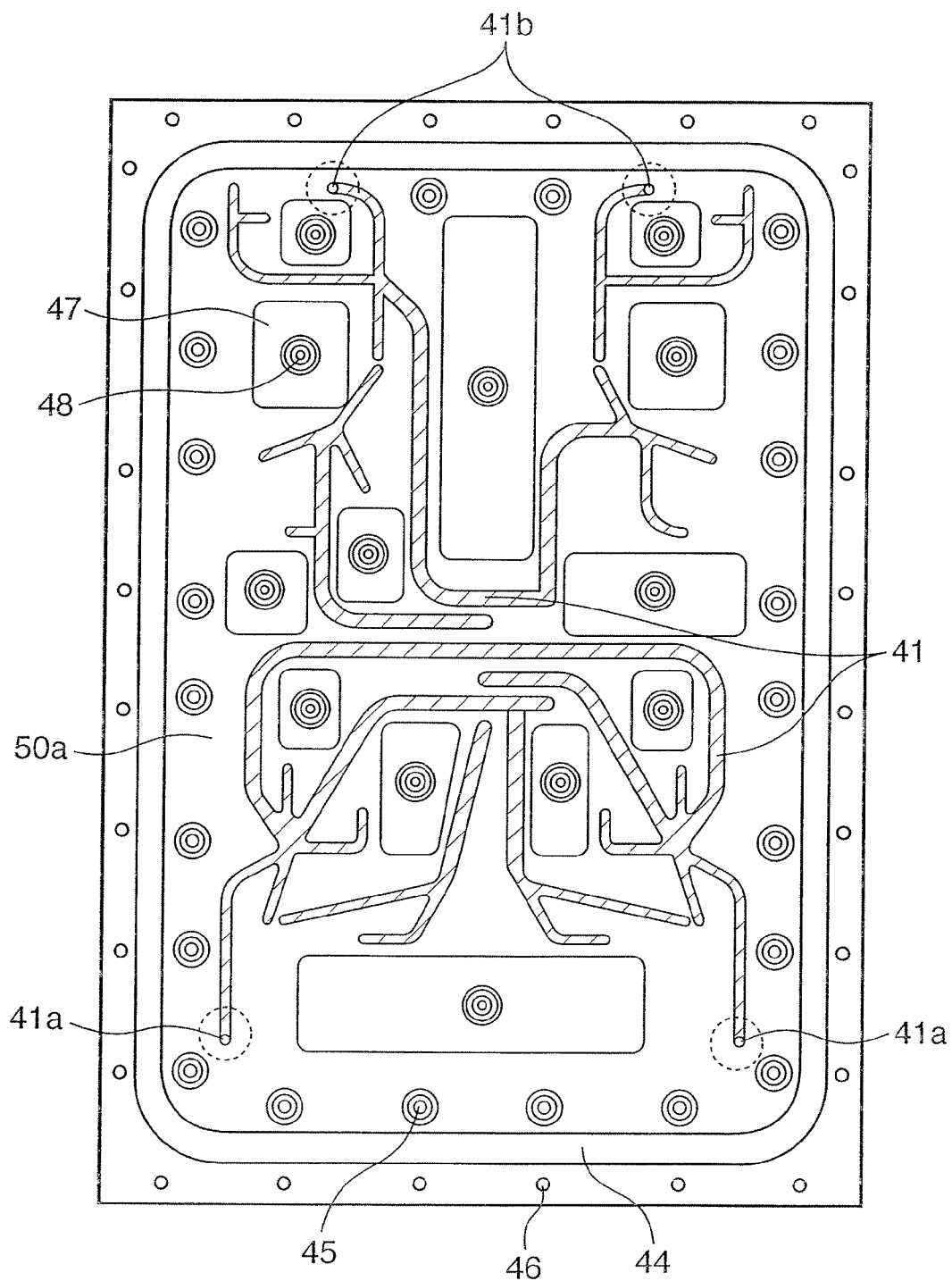
FIG. 5 is a view showing the third arrangement example according to the preferred embodiment of the present invention.
Figure 6:
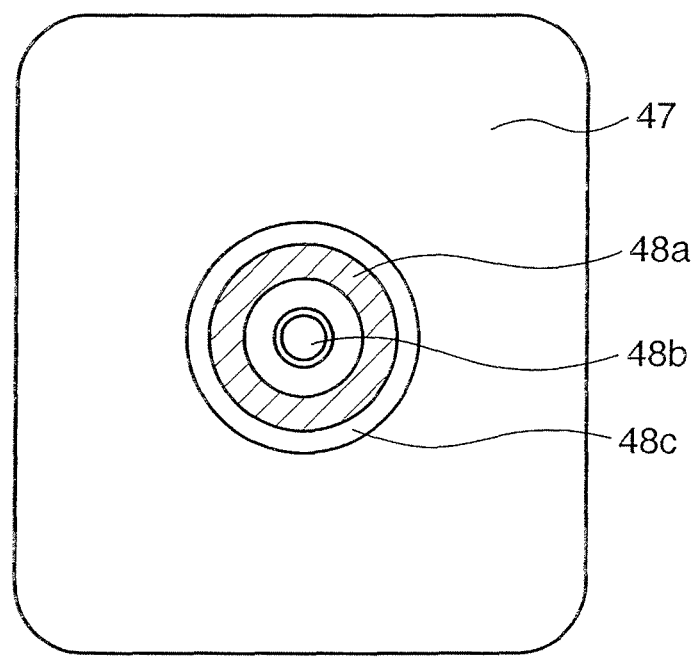
FIG. 6 is an enlarged view of an adhesive reservoir and a threaded hole portion formed within the adhesive reservoir.

FIG. 5 is a view exemplifying the third arrangement example, which is a modification of the second arrangement example shown in FIG. 4. The same reference numerals as those in this arrangement example denote the same parts as those in the second arrangement example. This arrangement example is obtained by adding to the arrangement of FIG. 4 threaded hole portions 48 within the respective adhesive reservoirs 47. FIG. 6 is an enlarged view of each adhesive reservoir 47 and the threaded hole portion 48 inside the adhesive reservoir 47. A threaded hole 48b is used to fasten the base plates 50a and 50b with fasteners such as bolts. A seal groove 48a (hatched portion) is a groove for a seal member, such as an O-ring, formed to prevent the cooling medium from leaking from the threaded hole 48b outside the stage base. A partition wall 48c is formed between the seal groove 48a and the adhesive reservoir 47 and can inhibit the cooling medium from leaking outside more effectively.

This arrangement example has the above-mentioned structure, in addition to the arrangement of FIG. 4. This arrangement example has the following features, in addition to the features (1) to (3) described in the first and second arrangement examples.

(4) By fastening the interiors of the respective adhesive reservoirs 47 with fasteners, such as bolts, a shearing force, which is generated by a pressure difference between the cooling medium and the outside of the stage base (vacuum or reduced-pressure atmosphere) and acts on the adhesive, is relaxed. Thus, peeling of the adhesive can be prevented.

Figure 11:
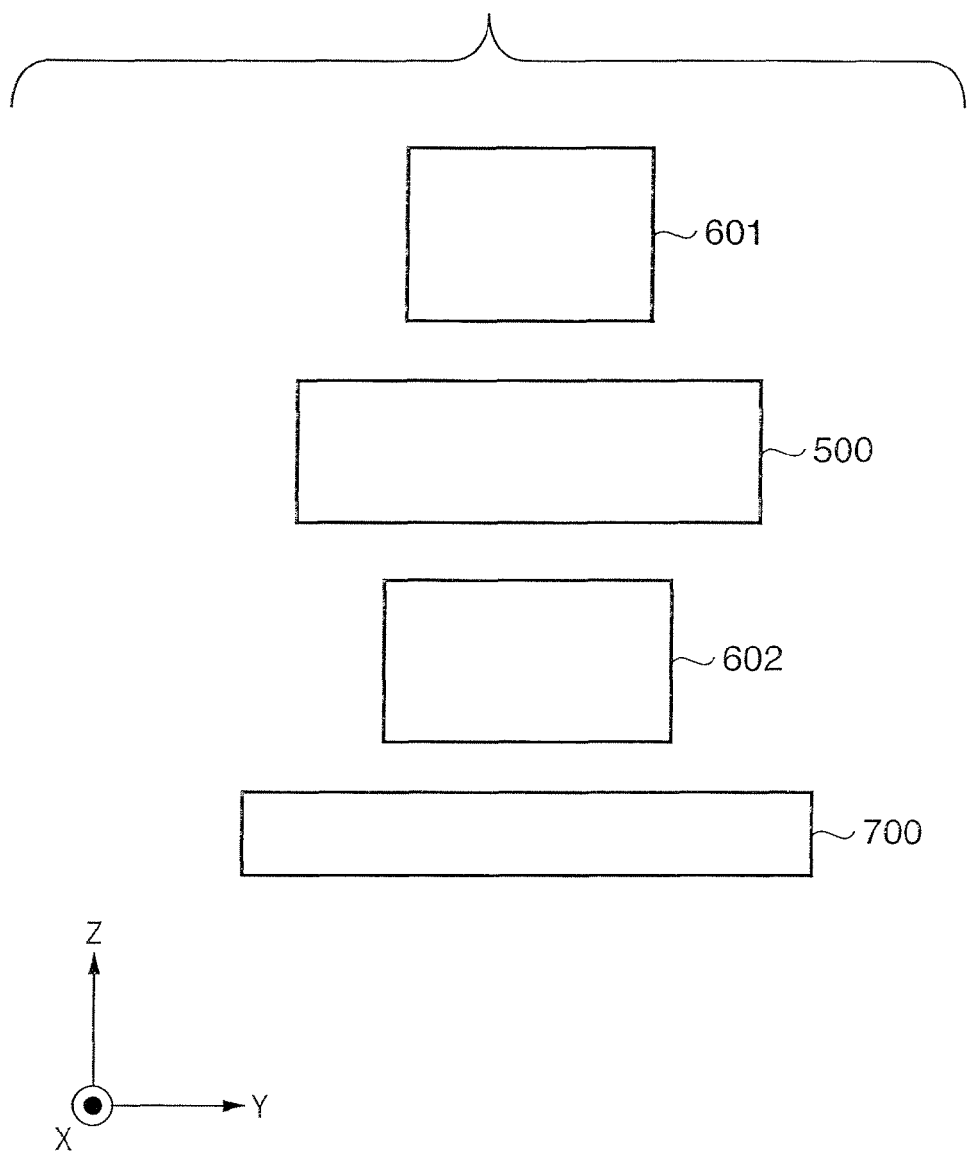
FIG. 11 is a view showing the concept of an exposure apparatus which uses a stage apparatus according to the preferred embodiment of the present invention.

FIG. 11 is a view schematically showing the arrangement of an exposure apparatus, which incorporates the stage apparatus according to the preferred embodiment of the present invention. In the example shown in FIG. 11, the stage apparatus is mounted as a wafer stage 700, and a mask stage 500 is mounted above the wafer stage 700. In the mask stage 500, a mask is held by a chuck above the mask stage 500. In the wafer stage 700, a wafer is held by a chuck provided for the fine adjustment stage 90. The mask is illuminated by an illumination optical system 601. The image of a pattern formed on the mask is projected and transferred onto the wafer through a projection optical system 602. In this manner, the exposure apparatus can align an object to be aligned (wafer) and perform an exposure operation, using the stage apparatus according to the preferred embodiment of the present invention. A photosensitive layer on the wafer serving as a substrate on which the pattern is transferred is developed to manufacture a semiconductor device. This exposure apparatus can be applied to a known manufacturing process of semiconductor devices.

According to the present invention, the number of resin tubes used to supply a cooling medium to components having cooling units can be suppressed.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2003-335643 filed on Sep. 26, 2003, which is hereby incorporated by reference herein.

What is claimed is:

1. A stage apparatus comprising:
    an X-Y stage configured to move in X-axis and Y-axis directions;
    a stage base plate provided on the X-Y stage, a through-hole being formed on the surface of the stage base plate;
    a fine adjustment stage configured to move relative to said stage base plate; and
    a component, which has (i) a coil configured to drive the fine adjustment stage relative to the stage base plate, placed on a surface of the stage base plate, and (ii) a cooling unit placed on the surface of the stage base plate, which cools the coil with a coolant,
    wherein a coolant channel, which communicates with the through-hole of the stage base plate, is formed inside the stage base plate, and the coolant is supplied to the cooling unit via the coolant channel and the through-hole, without passing through a pipe between the through-hole and the cooling unit.

2. The apparatus according to claim 1, wherein the cooling unit is a cooling jacket in which the coolant channel is formed and which covers the coil.

3. The apparatus according to claim 2, wherein the coolant channel includes a groove formed inside the stage base plate, and the groove and an opening of the cooling jacket are connected via the through-hole.

4. The apparatus according to claim 1, wherein the coolant channel comprises a plurality of lines, and the plurality of lines are arranged to have substantially the same line resistance.

5. The apparatus according to claim 1, wherein the component is connected to the coolant channel via a seal member.

6. The apparatus according to claim 5, wherein the seal member includes one of an O-ring, a gasket, and an adhesive.

7. The apparatus according to claim 1, wherein the stage base plate has a first structure on which a groove is formed and a second structure which is fixed on the first structure, the coolant channel being formed by an inner surface of the groove of the first structure and a surface of the second structure.

8. The apparatus according to claim 7, further comprising a seal member arranged between the first structure and the second structure, so as to surround the exterior of the coolant channel, with an interior and an exterior of the seal member being fastened with a fastener.

9. The apparatus according to claim 7, wherein the second structure is fixed to the first structure by an adhesive, and the first structure or the second structure has an adhesion groove which is filled with the adhesive.

10. The apparatus according to claim 9, wherein an interior of the adhesion groove is fastened with a fastener.

11. An exposure apparatus which aligns an object to be aligned and performs exposure, said apparatus comprising:
    a stage apparatus defined in claim 1.

12. A method of manufacturing a device, the method comprising:
    transferring a pattern onto a substrate using an exposure apparatus as defined in claim 11;
    developing the substrate to produce a developed substrate; and
    processing the developed substrate to manufacture a device.

13. A stage apparatus comprising:
    an X-Y stage configured to move in X-axis and Y-axis directions;
    a stage base plate provided on the X-Y stage, a through-hole being formed on the surface of the stage base plate;
    a fine adjustment stage configured to move relative to the stage base plate;
    a coil configured to drive the fine adjustment stage relative to the stage base plate; and
    a cooling jacket placed on the surface of the stage base plate, which covers the coil and cools the coil with a coolant,
    wherein a coolant channel, which communicates with the through-hole of the stage base plate, is formed inside the stage base plate, and the coolant is supplied to a cooling unit via the coolant channel and the through-hole, without passing through a pipe between the through-hole and the cooling unit.

* * * * *